United States Patent
Tsai

(10) Patent No.: US 8,371,565 B2
(45) Date of Patent: Feb. 12, 2013

(54) CLAMPING DEVICE AND COATING APPARATUS HAVING SAME

(75) Inventor: Tai-Sheng Tsai, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 315 days.

(21) Appl. No.: 12/859,266

(22) Filed: Aug. 19, 2010

(65) Prior Publication Data
US 2011/0248437 A1 Oct. 13, 2011

(30) Foreign Application Priority Data
Apr. 8, 2010 (TW) .............................. 99110832 A

(51) Int. Cl.
*B25B 1/00* (2006.01)
(52) U.S. Cl. .............. 269/152; 269/47; 269/21; 269/37; 269/289 R; 204/298.15
(58) Field of Classification Search ................... 269/903, 269/21, 289 R, 37, 47, 152; 204/298.15
See application file for complete search history.

(56) References Cited

U.S. PATENT DOCUMENTS

| | | | | |
|---|---|---|---|---|
| 2,792,037 A * | 5/1957 | Kenfield | ......................... | 269/47 |
| 3,507,248 A * | 4/1970 | Seeley et al. | ............ | 118/723 VE |
| 4,473,455 A * | 9/1984 | Dean et al. | ............... | 204/298.15 |
| 4,512,841 A * | 4/1985 | Cunningham et al. | ... | 156/345.43 |
| 4,676,193 A * | 6/1987 | Martin | ......................... | 118/720 |
| 4,767,984 A * | 8/1988 | Bakker | ..................... | 324/756.02 |
| 4,971,676 A * | 11/1990 | Doue et al. | ..................... | 118/503 |
| 5,169,684 A * | 12/1992 | Takagi | ........................ | 427/248.1 |
| 5,925,226 A * | 7/1999 | Hurwitt et al. | ............ | 204/298.15 |
| 6,171,462 B1 * | 1/2001 | Gries et al. | ................ | 204/298.15 |
| 6,783,299 B2 * | 8/2004 | Meron et al. | ................... | 403/325 |
| 2006/0130760 A1* | 6/2006 | Zultzke et al. | ................ | 118/719 |
| 2006/0196423 A1* | 9/2006 | Huang | ........................... | 118/720 |
| 2007/0000443 A1* | 1/2007 | Chien | ........................... | 118/720 |

* cited by examiner

Primary Examiner — Joshua J Michener
Assistant Examiner — Matthew Gitlin
(74) Attorney, Agent, or Firm — Altis Law Group, Inc.

(57) ABSTRACT

A clamping device for clamping a substrate with a first surface and a second surface includes a supporting plate and a number of clamping units. The supporting plate includes a base portion and an engaging portion. The base portion includes a base surface. The engaging portion protrudes from the base surface of the base portion and includes an engaging surface facing away from the base surface. The supporting plate defines a through hole in the engaging surface. The supporting plate is configured for supporting the substrate on the engaging surface of the engaging portion. The clamping units are configured for clamping the substrate on the supporting plate such that the engaging surface of the engaging portion engaging surface is substantially coplanar with the first surface of the substrate.

14 Claims, 4 Drawing Sheets

CLAMPING DEVICE AND COATING APPARATUS HAVING SAME

BACKGROUND

1. Technical Field

The disclosure relates to coating technology and, particularly, to a coating apparatus with a clamping device.

2. Description of Related Art

Infrared (IR) cut-off filters are configured to reflect or block mid-infrared wavelengths while passing visible light, and are generally equipped in cameras as key elements thereof. The IR cut-off filters are manufactured by forming IR cut-off films on substrates by applying an evaporation process, or another coating method such as sputtering process.

Generally, when coating an IR cut-off film on a surface of the substrate using for example, an evaporation process, a clamping device may first be provided to clamp the substrates. And then a functional material can be evaporated on the surface of the substrates to form the optical film. A typical clamping device generally includes two clamping jaws. In use, the two clamping jaws abut against two peripheral sides of the substrate. However, the evaporation process is generally applied with a high temperature above about 200° C., and the substrate tends to get distorted in such a high temperature. In such case, the IR cut-off film may not be coated on the substrate uniformly, and thus optical performance of the Infrared cut-off filter may be diminished in certain applications.

Therefore, what is needed, is a coating apparatus with a clamping device, which can overcome the above shortcomings.

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION

Embodiment of the coating apparatus will now be described in detail below and with reference to the drawings.

Figure 1:
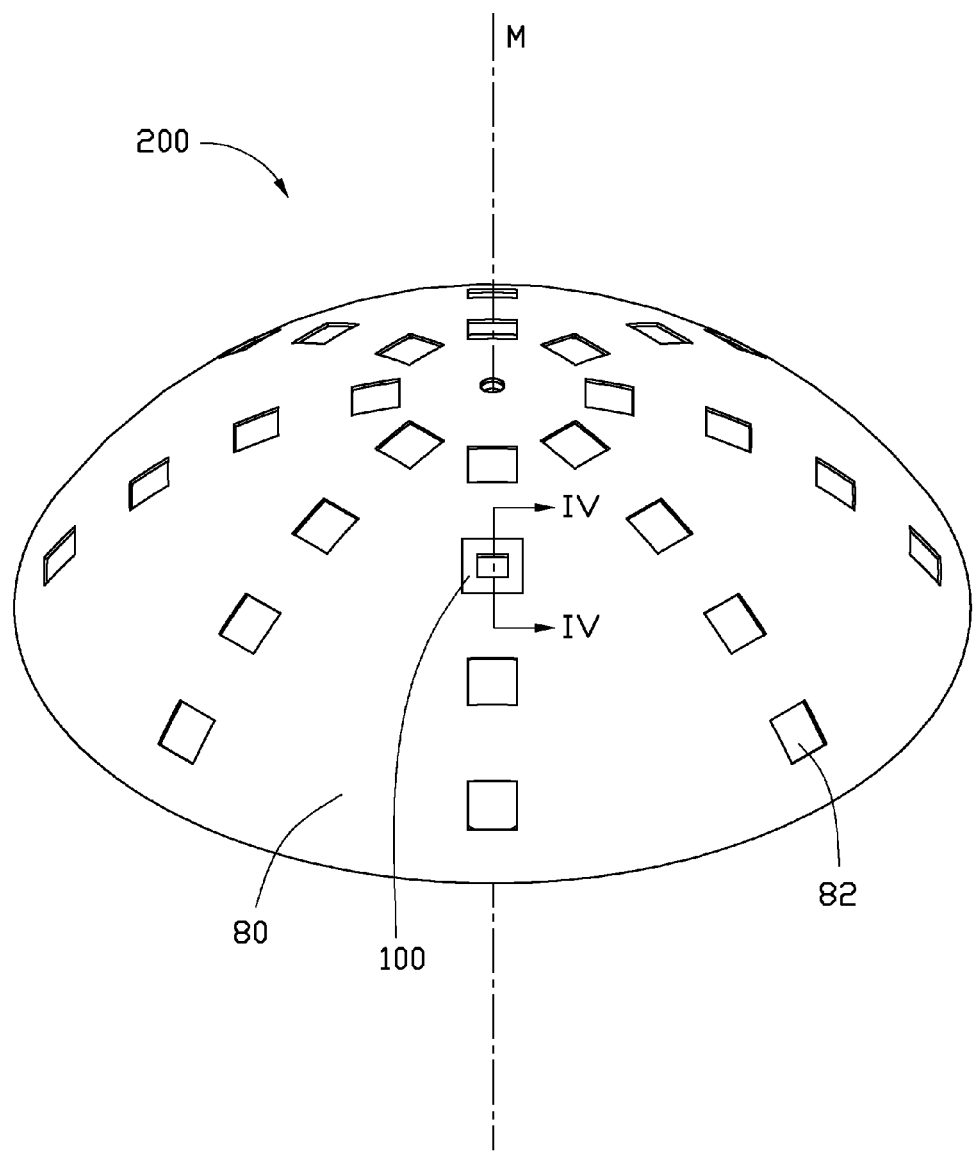
FIG. 1 is an isometric view of a coating apparatus in accordance with an exemplary embodiment, the coating apparatus including a support frame and a number of clamping devices.

Referring to FIG. 1, a coating apparatus 200 in accordance with an exemplary embodiment is shown. The coating apparatus 200 includes a support frame 80 and a number of clamping devices 100.

Figure 2:
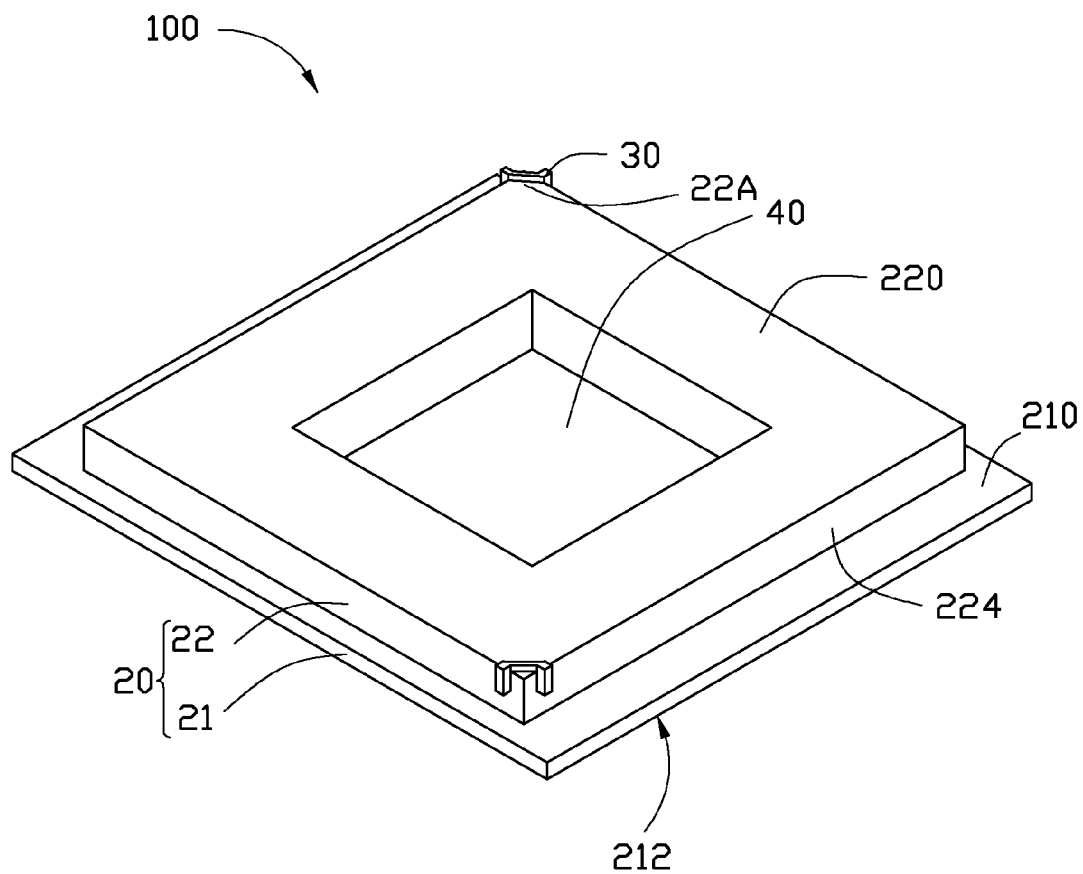
FIG. 2 is an isometric view of a single clamping device of FIG. 1, the clamping device including a supporting plate and two clamping units.
Figure 3:
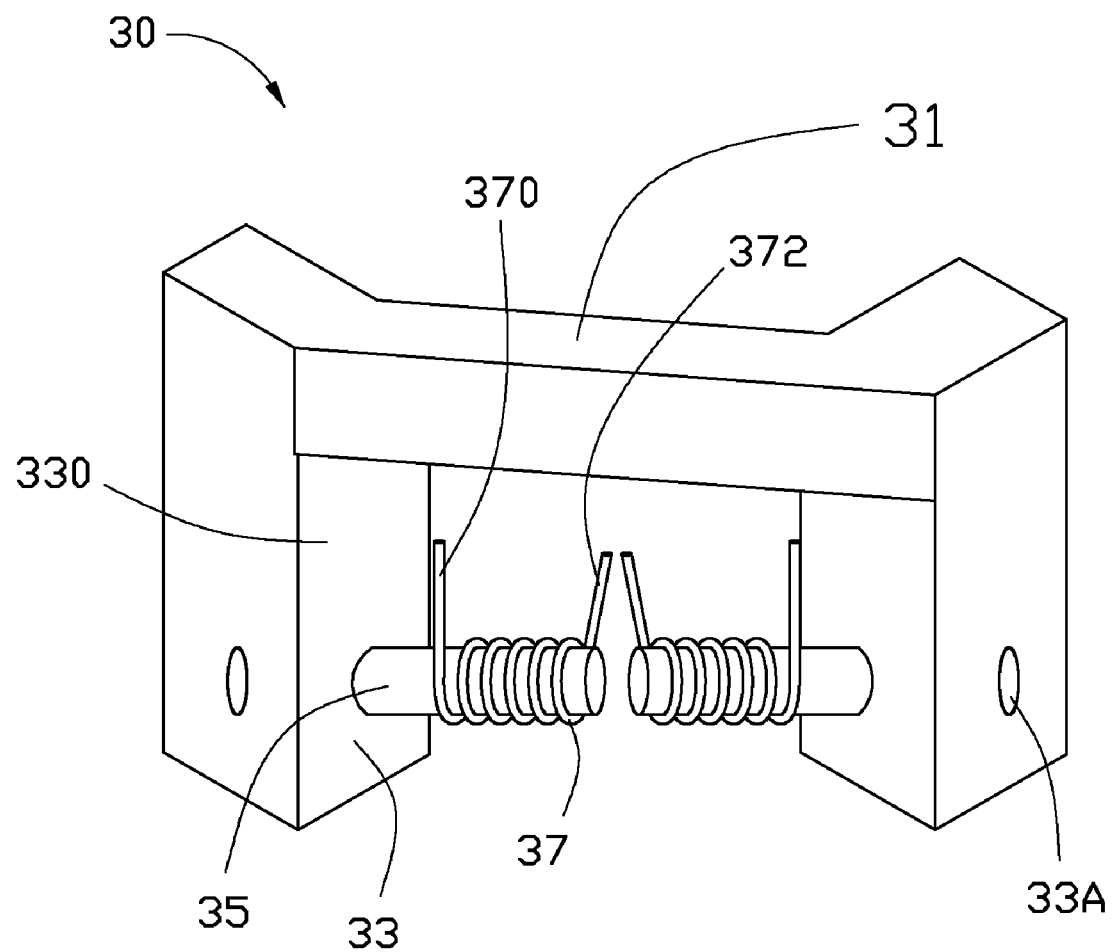
FIG. 3 an isometric view of a single clamping unit of FIG. 2.
Figure 4:
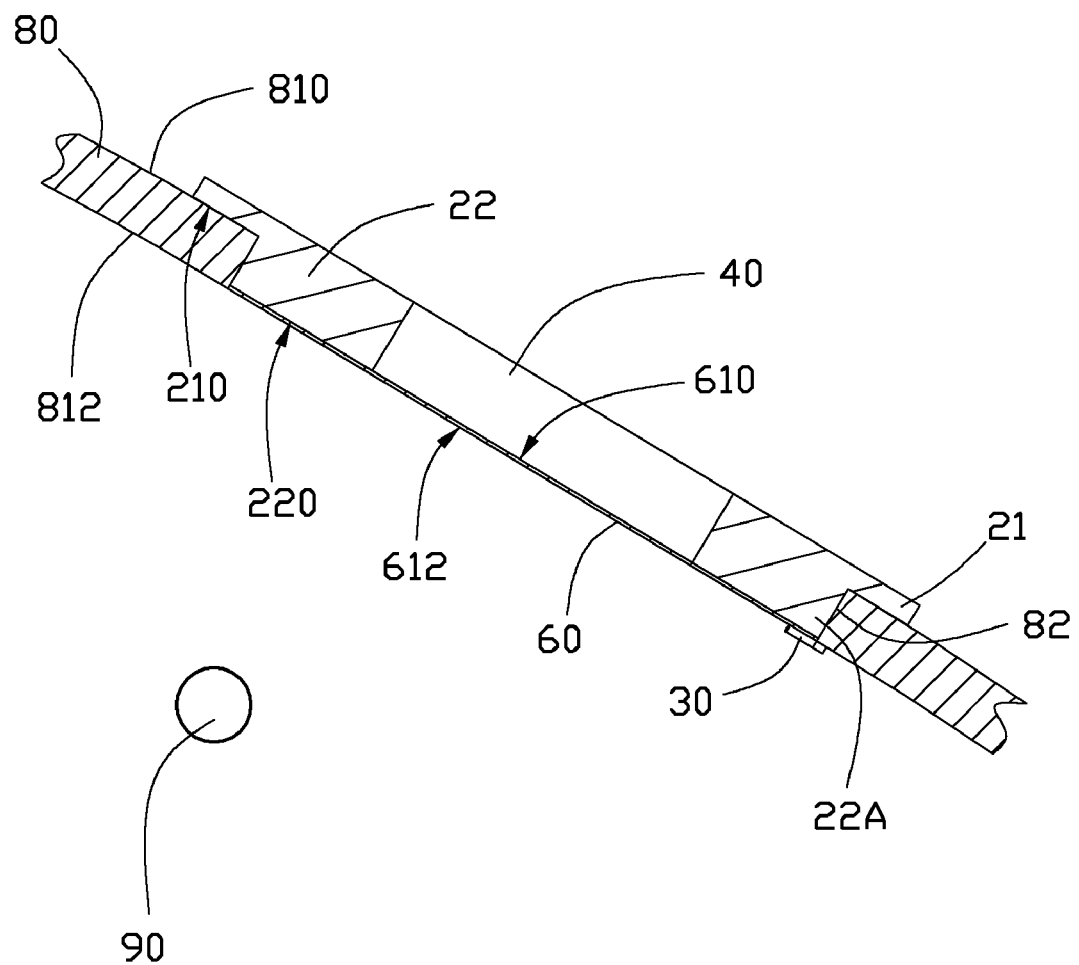
FIG. 4 is cross section of the coating apparatus of FIG. 1 taken along line IV-IV, showing a substrate being clamped by a clamping device on the supporting plate.

Referring also to FIG. 2 to FIG. 4, the support frame 80 includes a support surface 810, and a concave surface 812 facing away from the support surface 810 (see FIG. 4). In this embodiment, the support frame 80 is a curved plate, and includes a central axis M. The support frame 80 has a number of receiving holes 82 defined in the support surface 810. In this embodiment, the receiving holes 82 surround the central axis M, and are evenly dispersed on the support surface. The receiving hole 82 is generally cuboid-shaped. In alternative embodiments, the support frame 80 may have another shape, for example, a cuboid-shape. The support surface 810 and the concave surface 812 each can be an aspheric surface. The receiving hole 82 may be generally cylindrical.

As shown in FIG. 2, in this embodiment, the clamping device 100 includes a support plate 20 and two clamping units 30. The support plate 20 includes a base portion 21 and an engaging portion 22. The base portion 21 and the engaging portion 22 each are cuboid-shaped. The base portion 21 includes a base surface 210 and a lower surface 212 at two opposite sides thereof. The engaging portion 22 protrudes from a central portion of the base surface 210, and includes an engaging surface 220 and four side surfaces 224. In this embodiment, the engaging surface 220 is a flat surface facing away from the base surface 210. The four side surfaces 224 are located between, and adjoin the engaging surface 220 and the base surface 210. The support plate 20 has a through hole 40 defined in a central portion of the engaging surface 220. The through hole 40 is generally cylindrical. In alternative embodiments, the engaging surface 220 may have another shape. For example, the engaging surface 220 may be arc-shaped. The through hole 40 can be cuboid-shaped.

The engaging portion 22 includes four corners 22A around the through hole 40. The engaging portion 22 may have four holes (not visible) defined in the four respective side surfaces 224 at the diagonally opposite corners 22A. Each two holes located at a same corner are aligned with each other.

In this embodiment, the base portion 21 and the engaging portion 22 are integrally connected to each other. In alternative embodiments, the base portion 21 and the engaging portion 22 can be made separately, and the engaging portion 22 can be connected to the base portion 21 by applying adhesive therebetween.

As shown in FIG. 3, the clamping unit 30 includes a top board 31, two pedestals 33, two shafts 35, and two springs 37. The pedestal 33 extends downward from opposite ends of the top board 31. In this embodiment, the top board 31 and the two pedestals 33 are integrally connected to each other. Each of the top board 31 and the two pedestals 33 is substantially cuboid-shaped. Each of the two pedestals 33 has a lateral surface 330. A lengthwise direction of one lateral surface 330 intersects with a lengthwise direction of the other lateral surface 330. The two lateral surfaces 330 are perpendicular to each other in the lengthwise directions thereof. The two shafts 35 are attached to the two respective lateral surfaces 330. In one typical example, two through holes 33A can be defined at two respective lateral surfaces 330. The two shafts 35 can extend through the two respective through holes 33A, and thus can be attached to the two pedestals 33. The two springs 37 are arranged around the two respective shafts 35. In this embodiment, the two springs 37 each can be a torsional spring with a first end 370 and a second end 372. The two shafts 35 are aligned with each other.

In assembly, the top board 31 and the two pedestals 33 can be arranged on the engaging portion 22 by inserting the two shafts 37 into the two aligned respective holes at the corner 22A of the support plate 20. The two springs 37 are received in the two respectively aligned holes. The first end 370 is attached to the pedestal 33, and the second end 372 is attached to the engaging portion 22.

In this embodiment, the clamping device 100 includes two clamping units 30. The two clamping units 30 are used to clamp the substrate 60 to the engaging surface 220 of the engaging portion 22. In use, the two clamping units 30 are respectively arranged at the diagonally opposite corners 22A. In alternative embodiments, the clamping device 100 may includes four clamping units 30. The four clamping units 30 may be respectively arranged at four corners 22A.

As shown in FIG. 4, the substrate 60 can for example be made of glass. In this embodiment, the substrate 60 is generally cuboid-shaped, and includes a first surface 610 and a second surface 612 at opposite sides thereof. In this embodiment, the first surface 610 and the second surface 612 each are flat surfaces. A surface area of the first surface 610 or the second surface 612 is generally equal to that of the engaging surface 220.

In assembly of the clamping device 100 on the support frame 80, the base portion 21 of the support plate 20 is arranged on the support surface 810 of the support frame 80. The engaging portion 22 of the support plate 20 is received in the receiving hole 82 of the support frame 80. The top board 31 of the clamping unit 30 can be pulled away from the engaging portion 22, allowing the substrate 60 to be arranged on the engaging surface 220 of the engaging portion 22. In this embodiment, the base surface 210 intimately contacts with the support surface 810 of the support frame 80. The engaging portion 22 is received in the through hole 40. The engaging surface 220 of the four corners 22A is covered by the substrate 60. A central portion of the second surface 612 is exposed to the through hole 40. When the pulling force is unloaded, the spring 37 applies an elastic recovery force on the two pedestals 33, forcing the top board 31 toward the substrates 60 to locate above the first surface 610, thus abutting the substrates 60 against the engaging portion 22 of the support frame 20. Thus, the substrates 60 are clamped by the clamping units 30.

The coating apparatus 200 can be used to apply evaporation process, or another coating method such as sputtering process. In this embodiment, a target 90 can be provided and arranged to face the concave surface 812 of the support frame 80. The target 90 is configured for generating target material. During application of the evaporation process, the substrates 60 is applied at a high temperature above about 200° C., and a target material from the target 90 can be coated on the second surface 612 of substrates 60. Thus, a film, such as an IR cut-off film can be formed on the second surface 612. In this embodiment, the second surface 612 of the substrate 60 is coplanar (flush) with the concave surface 812 of the support frame 80 when the clamping units 30 clamp the substrate 60. With this configuration, the blocking of the target material by the support frame 80 from the second surface 612 is avoided. Alternatively, the second surface 612 of the substrate 60 may protrude from the concave surface 812 of the support frame 80.

In general, a spectrometer (not shown) can be provided to measure a thickness of the film by emitting light to the film and measuring properties of the light transmitting through the film and the substrates 60. In this embodiment, the through hole 40 is configured for allowing light to pass therethrough to the spectrometer.

One advantage of the coating apparatus 200 is that the coating apparatus 200 is equipped with the support plate 20 and the clamping units 30. The clamping units 30 and the engaging portion 22 cooperatively clamp the substrate 60 on the engaging surface 220 of the engaging portion 22. In this embodiment, the top board 31 abuts the substrate 60 against the engaging portion 22, thus an outer periphery of the first surface 610 is maintained coplanar with the engaging surface 220 of the engaging portion 22. Thus, intimate contact between the first surface 610 of the substrate 60 and the engaging surface 220 of the support plate 20 is maintained, distortion of the substrate 60 under high temperature is avoided. The first surface 610 and the second surface 612 remains flat when applying evaporation process or sputtering process. Therefore, the film can be uniformly coated on the second surface 612 of the substrate 60.

It is understood that the above-described embodiment are intended to illustrate rather than limit the disclosure. Variations may be made to the embodiment without departing from the spirit of the disclosure. Accordingly, it is appropriate that the appended claims be construed broadly and in a manner consistent with the scope of the disclosure.

What is claimed is:

1. A clamping device for clamping a substrate with a first surface and a second surface at opposite sides thereof, the clamping device comprising:
    a supporting plate comprising a base portion and an engaging portion, the base portion comprising a base surface, the engaging portion protruding from the base surface of the base portion and comprising an engaging surface facing away from the base surface, the supporting plate defining a through hole in the engaging surface for allowing light to pass therethrough, the supporting plate configured for supporting the substrate on the engaging surface of the engaging portion; and
    a plurality of clamping units configured for clamping the substrate on the supporting plate such that the engaging surface of the engaging portion is maintained substantially coplanar with the first surface of the substrate, each of the clamping units comprising:
        a top board;
        two pedestals extending from opposite ends of the top board, each of the two pedestals comprising a lateral surface, wherein the lateral surface of each of the two pedestals defines a through hole;
        two shafts attached to the respective pedestals, the shafts being respectively received in the through holes of the lateral surfaces of the two pedestals; and
        two torsional springs surrounding the respective shafts, the torsional springs each comprising a first end attached to the pedestal, and a second end attached to the engaging portion.

2. The clamping device of claim 1, wherein the engaging portion is cuboid-shaped and comprises four corners around the through hole, the engaging surface is rectangular-shaped, and the plurality of clamping units comprise two clamping units respectively arranged at two diagonally opposite corners of the engaging portion.

3. The clamping device of claim 1, wherein a surface area of the engaging surface is smaller than that of the base surface, and the engaging portion protrudes from a central portion of the base surface of the base portion.

4. The clamping device of claim 1, wherein the engaging surface is a flat surface.

5. The clamping device of claim 1, wherein the through hole defined in the engaging surface is cylindrical or cuboid-shaped.

6. A coating apparatus comprising:
    a support frame comprising a supporting surface and a plurality of receiving holes defined in the supporting surface;
    a plurality of clamping devices received in the receiving holes configured for clamping a plurality of substrates on the support frame, each substrate having a first surface and a second surface at opposite sides thereof, each clamping device comprising:

a supporting plate comprising a base portion with a base surface and an engaging portion protruding from the base surface of the base portion, the base portion being arranged on the support frame with the base surface being coplanar with the supporting surface, the engaging portion being received in the receiving hole and comprising an engaging surface facing away from the base surface, the supporting plate defining a through hole in the engaging surface for allowing light to pass therethrough, and the supporting plate configured for supporting the substrate on the engaging surface of the engaging portion; and a plurality of clamping units configured for clamping the substrate on the supporting plate such that the engaging surface of the engaging portion is maintained substantially coplanar with the first surface of the substrate, wherein each of the clamping units comprises:

a top board;

two pedestals extending from opposite ends of the top board, each of the two pedestals comprising a lateral surface, wherein the lateral surface of each of the two pedestals defines a through hole;

two shafts attached to the respective pedestals, the shafts being respectively received in the through holes of the lateral surfaces of the two pedestals; and two torsional springs surrounding the respective shafts, the torsional springs each comprising a first end attached to the pedestal, and a second end attached to the engaging portion; and a target configured for facing toward the second surfaces of the substrates.

7. The coating apparatus of claim 6, wherein the engaging portion is cuboid-shaped and comprises four corners around the through hole, the engaging surface is rectangular-shaped, and the plurality of clamping units comprises two clamping units respectively arranged at two diagonally opposite corners of the engaging portion.

8. The coating apparatus of claim 6, wherein a surface area of the engaging surface is smaller than that of the base surface, and the engaging portion protrudes from a central portion of the base surface of the base portion.

9. The coating apparatus of claim 6, wherein the engaging surface is a flat surface.

10. The coating apparatus of claim 6, wherein the through hole defined in the engaging surface is cylindrical or cuboid-shaped.

11. The coating apparatus of claim 6, wherein the support frame includes a concave surface facing away from the supporting surface, and the target faces the concave surface.

12. The coating apparatus of claim 11, wherein when the substrates are clamped to the support frame, the second surfaces of the substrates are substantially flush with the concave surface of the support frame.

13. The coating apparatus of claim 11, wherein when the substrates are clamped to the support frame, the second surfaces of the substrates protrude from the concave surface of the support frame.

14. A sputtering apparatus comprising:

a target;

a curved plate comprising a plurality of receiving holes, the curved plate having a concave surface facing the target;

a plurality of rectangular supporting plates engaged in the respective receiving holes, each supporting plate having a supporting surface facing the target and configured for supporting a plate-shaped substrate thereon, each supporting plate including a through hole; and two clamping units respectively mounted on diagonally opposite corners of each supporting plate, and configured for securing a corresponding substrate on the support plate and maintaining intimate contact between the substrate and the supporting surface, each of the clamping units comprising:

a top board;

two pedestals extending from opposite ends of the top board, each of the two pedestals comprising a lateral surface, wherein the lateral surface of each of the two pedestals defines a through hole;

two shafts attached to the respective pedestals, the shafts being respectively received in the through holes of the lateral surfaces of the two pedestals; and two torsional springs surrounding the respective shafts, the torsional springs each comprising a first end attached to the pedestal, and a second end attached to the engaging portion.

* * * * *